United States Patent [19]

Langowski

[11] Patent Number: 4,996,078
[45] Date of Patent: Feb. 26, 1991

[54] METHOD OF REMOVING PARTICLES FROM SUBSTRATE SURFACES

[75] Inventor: Horst-Christian Langowski, Hanover, Fed. Rep. of Germany

[73] Assignee: 501 Philips & Du Pont Optical Company, New York, N.Y.

[21] Appl. No.: 471,184

[22] Filed: Jan. 26, 1990

[30] Foreign Application Priority Data

Feb. 1, 1989 [DE] Fed. Rep. of Germany ....... 3902862

[51] Int. Cl.$^5$ .............................................. B05D 3/06
[52] U.S. Cl. .................................... 427/38; 427/255.5; 427/264; 427/265; 427/294; 427/348; 427/402
[58] Field of Search ...................... 427/38, 255.7, 348, 427/255.5, 264, 265, 294, 402

[56] References Cited

U.S. PATENT DOCUMENTS 4,683,149 7/1987 Suzuki et al. .................... 427/255.7

*Primary Examiner*—Bernard Pianalto
*Attorney, Agent, or Firm*—Norman N. Spain

[57] ABSTRACT

A method is described for the vacuum-coating of substrates, such as glass plates, foils, plastics substrates for optical discs etc., in which the substrates are introduced into a vacuum-coating arrangement and are vacuum-coated in accordance with a PVD (physical vapour-deposition) process such as for example cathode sputtering or vapour-deposition. In order to avoid pinholes in the coating the method is carried out in three steps, namely a first PVD step, in which the substrates and any particles adhering thereto are coated; a particle-displacement step in which the coated particles are displaced from their initial positions on the substrate; and an additional, second PVD step, in which the substrates are coated a second time to cover the defects formed in the coating by adhering particles in the first coating step.

12 Claims, 2 Drawing Sheets

METHOD OF REMOVING PARTICLES FROM SUBSTRATE SURFACES

SUMMARY OF THE INVENTION

The invention relates to a method for the vacuum-coating of substrates, such as glass plates, foils, plastics substrates for optical discs etc., the substrates being introduced into a vacuum-coating arrangement and being provided with a layer in a vacuum in accordance with a physical vapor-deposition (PVD) process, such as for example cathode-sputtering or vapor-deposition.

Such methods are known and are employed for example, for coating CD-records, architectural glass etc., see for example European Patent Application No. 0,277,536 A1 and the comprehensive literature on this subject, for example Vakuumtechnik, 24 (1975), "Die Herstellung dunner Filme durch Kathodenzerstaubung" by K. Reichelt, and Airco Temescal (1977), "Production Sputter-metallization of Exterior Plastic Automotive Parts" by Les Huges, R. Lucariello and P. Blum (which are herewith incorporated by reference).

A problem which occurs frequently in the prior art are annoying defects in the deposited layer, which result from the substrate surface being contaminated with particles. The particles adhere to the substrate surface and are also coated during the coating process. If in a subsequent step the particles are removed from the original positions the coating will exhibit holes which are clearly visible in transmission and which are referred to as "pinholes". In the extreme case this may even impair the required product specifications and lead to rejects; for example the readability of the optical data carriers may be impaired because the pinholes may be of the order of magnitude of the optical information structure of the data carrier.

In view of this problem many proposals have already been made for an effective removal of particles adhering to the substrates prior to the coating of said substrates. For example, Japanese Patent Application No. 84-1677 (A), which has been laid open to public inspection, describes a device in which movable molecular beam configurations are arranged in an evaporation chamber to remove the particles adhering to the substrate by means of gas jets. In practice it is found that a complete removal of particles adhering to the substrate is very difficult; generally the particles are merely displaced and can settle on the substrate at another location. Moreover, another serious drawback of the known device is that even if the particles are removed completely from the substrate they reach the evaporation source, where they may have a detrimental effect.

It is an object of the invention to provide a method and an arrangement for carrying out the method enabling the substrate to be provided with a layer which is completely or substantially free from the undesirable pinholes by means of a physical vapor-deposition process.

In contradistinction to the prior art the invention is characterized in that the method comprises at least three steps, namely: a first PVD step, in which the substrates and any particles adhering thereto are coated; a particle-displacement step inside the vacuum-coating arrangement, in which step the coated particles are displaced from their initial positions on the substrate; and an additional, second PVD step, in which the substrates are coated a second time to cover the defects caused in the layer by the adhering particles formed in the first deposition step.

The invention is based on the recognition of the surprising fact that, in order to avoid pinholes in products coated by means of a PVD process, it is not necessary to avoid the presence of particles on the substrate. It is found that by means of the invention the harmful effect of the particles can be avoided in that the particles are displaced only slightly, i.e. over a very small distance, from their initial positions. In accordance with the inventive idea this requires that prior to this the part of the substrate to which the particles are transferred from their initial position, is provided with a layer deposited by means of a PVD process. After the displacement, when the particles are situated at a harmless location, a second layer is deposited. A special feature of products manufactured by means of the inventive method is that the particles may still be situated on the substrate surface but that the product is neither impaired by the presence nor by the subsequent displacement or removal of the particles.

DETAILED DESCRIPTION OF THE INVENTION

Figure 1:
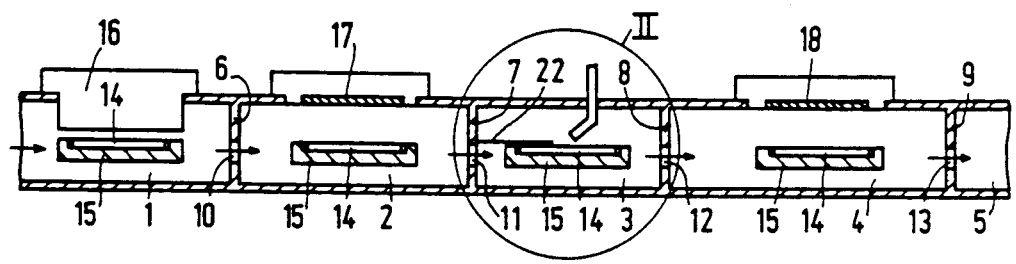
FIG. 1 is a diagrammatic sectional view of a part of a cathode sputtering arrangement for the stepwise metallization of optical media in a continuous stream.

Many known PVD methods are of a discontinuous type, i.e. the substrates are introduced into the processing chamber, said chamber is hermetically sealed and evacuated, the substrates are coated in vacuum, the processing chamber is resorted to atmospheric pressure, and subsequently the coated products are removed from the processing chamber. However, there is an increasing trend to use methods in which, in order to increase the productivity and to reduce the manufacturing costs the substrates are passed through an arrangement in a more or less continuous stream, the arrangement comprising a plurality of stations which are separated from one another by locks or gates. Such an arrangement is known for example from the said European Patent Application No. 0,277,536. A method in accordance with the invention, which is very suitable for use in conjunction with such a state-of-the-art arrangement is characterized in that inside the vacuum-coating arrangement the substrate is transferred from a first PVD station to a particle displacement station and subsequently from the particle-displacement station to a second PVD station. It is to be noted that is known per se, inter alia from the afore-mentioned European Patent Application to arrange a plurality of PVD stations side by side in a PVD arrangement, so that the substrate consecutively traverses a plurality of PVD processing chambers. This is often necessary because the substrate is pretreated in one or more stations before being provided with the actual coating. Generally several stations are used in order to increase the rate of passage of the substrates through the arrangement and in each of the processing stages a part of the overall thickness of the final coating is deposited. Generally, coatings of different composition are applied in the respective stations. However, arranging, in accordance with the invention, a particle-displacement station between two PVD stations is not known.

An embodiment of the invention is characterized in that a gas jet is employed for the displacement of the particles. On account of the dimensioning of the evacuation pump required in a PVD arrangement it will generally be important to minimize the amount of gas used for the displacement of the particles on the substrate. In this respect an embodiment of the invention is of significance, which is characterized in that the gas jet is formed by a supersonic molecular beam. The kinetic energy required for the displacement of the particles on the substrate should be provided by the gas particles of the gas jet. The required amount of gas can be reduced by increasing the velocity of the gas particles, so that it is advantageous if the gas particles in the gas jet are given a maximal velocity. A velocity far in excess of the velocity of sound can be obtained by giving the nozzle aperture through which the gas jet enters the vacuum chamber a special shape. For this reference is made to, for example the article: "Molekulspektroskopie in kalten Dusenstrahlen", Physikalische Blatter 43 (1987), no 1, by W. Demtroder and H. J. Foth, in which velocities up to a hundred times the velocity of sound are mentioned.

The required amount of gas can be further reduced in an embodiment of the invention, which is characterized in that the gas jet is pulsating. The influence of the influx of gas into the particle-displacement station on the process can be further reduced by utilising a preferred embodiment of the invention, which is characterized in that the gas required for particle displacement is identical to the gas used as process gas in the two coating steps. In many cathode-sputtering arrangements the process gas is, for example, argon. Argon is inherently suitable for the said purpose because this gas does not condensate in vacuum.

An embodiment which employs a gas jet for the displacement of the particles is characterized in that the gas jet sweeps the substrate across its entire width. A major advantage of this embodiment is that it does not require a movable nozzle in order to sweep the substrate surface. Movable parts are always undesirable in PVD plants because they are susceptible to give rise to problems as a result of soiling and because particles are produced as a result of wear. Moreover, the use of gas jet which covers the entire width of the substrate results in the rate of passage of the product through the arrangement being increased.

In order to reduce the amount of gas required when a pulsating gas jet is used for the displacement of the particles a further embodiment is of significance, which is characterized in that the jet width, the pulse duration and the pulse frequency as well as the speed of transport of the substrate are adapted to one another in such a way that substantially the entire coated substrate surface is covered during passage underneath the jet. In this respect, "substantially" is to be understood to mean such a mutual adaptation that at least a significant part of the substrate is covered, thereby preventing a substantial number of particles from being displaced not at all or not adequately.

A favourable embodiment of the invention is characterized in that the substrate is passed through a first gas barrier, for example a lock or an gate, between the first PVD station and the particle-displacement station and in that the substrate passes a second gas barrier on its way to the second PVD station. This reduces the likelihood that particles which have become detached completely from the substrate can contaminate the PVD stations. If the particle-displacement station employs gas jets for the displacement of the particles this enables the likelihood of an overdose of gas or an undesired type of gas from penetrating the PVD stations to be reduced.

An embodiment of the inventive method of another type than defined above is characterized in that a beam of electrically charged particles, for example an electron or ion beam is employed for particle displacement. It is to be noted that the use of an electron beam or an ion beam for the removal of dust particles from substrates is known per se, namely from the technology for the fabrication of semiconductor circuits on silicon wafers. For example, from Japanese Patent application No. 87-124284 (A), which has been laid open to public inspection, it is known to impart a negative electric charge to the surface of the silicon wafer by means of an electron beam and subsequently to pass said silicon wafer underneath a rod-shaped electrode which by means of a direct voltage source, is given a positive electric potential relative to the substrate to enable the negatively charged dust particles to be removed from the substrate surface under the influence of the electrostatic forces acting between the rod-shaped electrode and the dust particles. Such a known method may also be employed in the inventive method.

A further embodiment of the invention is characterized in that the intensity and the energy of the beam is adequate to displace the particles under the influence of electrostatic forces between the substrate and the particles. This phenomenon is known per se by users of electron microscopes. When a substrate to be ob served, having a vapor-deposited contrast-enchanging metal coating is exposed to an electron beam in the vacuum chamber of an electron microscope it is often found that a sudden disturbance occurs in the image being scanned, which is caused by a particle coming off the substrate. This phenomenon is suspected to arise as follows. The particle which sticks to the substrate is provided with a metal coating together with the substrate. However, locally there is not metal layer between the particle and the substrate because at this location the substrate is shaded off by the particle and is therefore not covered with metal. As a result of the electron beam the particle on the metallised surface is charged electrically. Since the particle is insulated relative to the surrounding metallised part of the substrate differences in magnitude of the electric charge and the electric potential between the particles and the surrounding portion of the substrate may lead to such electrostatic forces between the particle and the surrounding substrate that the particle is displaced from its original position. This results in a non-metallised area of the substrate, causing a disturbance in the image. Surprisingly this phenomenon, which until now was known only as an annoying effect in electron microscopy, can be utilised advantageously for the invention.

When an electron beam is used an embodiment is also of significance, which is characterized in that the coated substrate surface as it passes underneath the beam of electrically charged particles is exposed substantially without interruption.

The invention relates not only to a method but also to an arrangement for carrying out the method. A suitable embodiment is, for example, an arrangement which is characterized in that for said three steps of the method three separate stations are provided, which are separated from one another by gas barriers and which are arranged side-by-side. The advantages thus obtained have already been mentioned.

Embodiments of the invention will now be describedin more detail, by way of example, with reference to the accompanying drawings.

The part of the arrangement shown in FIG. 1 comprises five stations 1 to 5, which are separated from one another by partitions 6 to 9 with gas lock 10 to 13. The substrates 14 are arranged on substrate carriers 15 which by means of a transport device, not shown are transferred from one station to another via the locks in the direction indicated by said arrows. The locks are of the gate type, for example as employed in the known sputtering plants, for example in the device CDI 603 from Messrs. Balzers.

The station 1 is a pretreatment station comprising an etching device 165, which in the customary manner comprises a glow-discharge arrangement. The stations 2 and 4 form a first and a second metallising station respectively. They comprise first and second sputtering cathodes 17 and 18, for example made of aluminium. In accordance with the invention the particle-displacement station 3 is interposed between the two metallising stations. Two embodiments of a particle-displacement station will be described in greater detail with reference to FIGS. 2 to 5.

Figure 2:
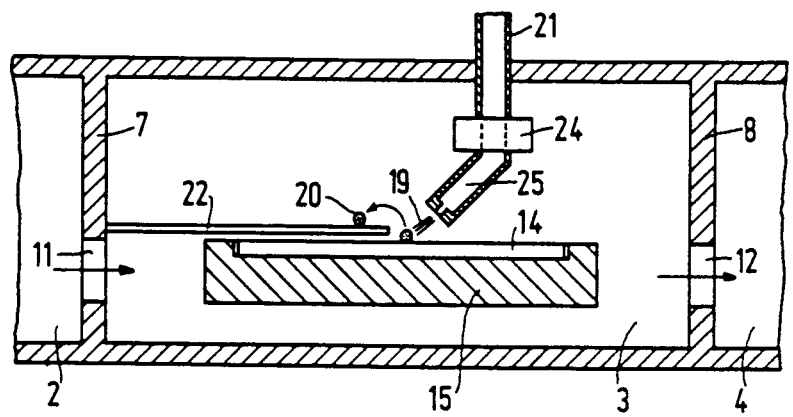
FIG. 2 shows the particle-displacement station of the cathode-sputtering arrangement in FIG. 1 in an enlarged scale.
Figure 3:
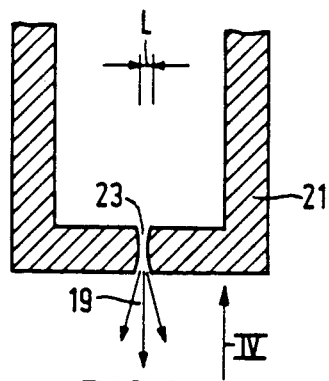
FIG. 3 is an enlarged scale sectional view of the nozzle of a molecular beam configuration as shown in FIG. 2.
Figure 4:
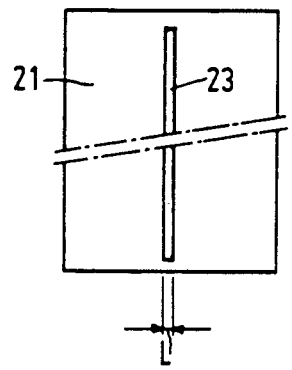
FIG. 4 shows the nozzle in a front view taken on the arrow V in FIG. 4, FIG. 5, in the same way as FIG. 2, is a sectional view of another embodiment of the particle-displacement station.

The FIGS. 2 to 4 relate to an embodiment in which a gas jet 19 is used for the displacements of the particles 20 on the surface of the substrate 14. In the particle-displacement station 3 a molecular beam configuration 21 is arranged which in a manner not shown is connected to a gas source. Preferably, the gas is of a type which can be used as a process gas in the cathode-sputtering arrangement, for example argon. By means of the gas jet 19 the particles 20 on the surface of the substrate 14 are displaced over a specific distance, for example a distance of only a few tenths of a millimeter. In order to illustrate a possible further embodiment of the invention FIG. 2 shows a collector plate 22 for collecting particles which have become detached completely from the substrate surface. The collector plate can be brought at such an electric potential by appropriate means that the particles which have become detached from the substrate are attached to said plate by electrostatic forces. Obviously, this is in order to ensure that the collected particles stick to the collector plate.

The molecular beam configuration 21 has a slotted nozzle 23 covering the entire width of the substrate, see in particular FIG. 4. Depending on the field of use it is possible to use a molecular-beam configuration comprising a plurality of nozzles each having a smaller width instead of one nozzle covering the entire substrate width. The entire substrate width can then still be covered by a suitable arrangement.

As already stated, it is advantageous if the gas jet 19 operates in the supersonic range. This requires an accurate and critical design of the nozzle 23. The slot length L1 of the nozzle may be for example of the order of magnitude of 5 to 10 $\mu$m. FIG. 3 shows the approximate shape of the nozzle which should be initially converging and subsequently diverging, the gas velocity corresponding to the velocity of sound at the narrowest location, i.e. in the throat of the nozzle. For further information as regards the design of the nozzle reference is made, for example, to the aforementioned article "Molekulspectroskopie in kalten Dusenstrahlen".

As already stated, it may be advantageous in order to minimise the required flow volume of the gas to employ a pulsating gas stream. In order to obtain such a stream an electrically operable valve 24 may be arranged in the molecular beam configuration 21. Preferably, the volume 25 of that part of the molecular beam configuration which is disposed downstream of the valve is minimal because the amplitude of the pressure variation will be reduced substantially if the volume is too large. The overall width of the nozzle or nozzles the pulse frequency and the pulse duration as well as the speed of transport of the substrates are preferably adapted to one another in such a way that, in principle, the entire substrate surface is covered substantially completely during passage underneath the gas jet or the gas jets. Presumably, the pulsation of the gas jet not only assists in reducing the gas-flow volume but also in detaching particles sticking to the surface.

Figure 5:
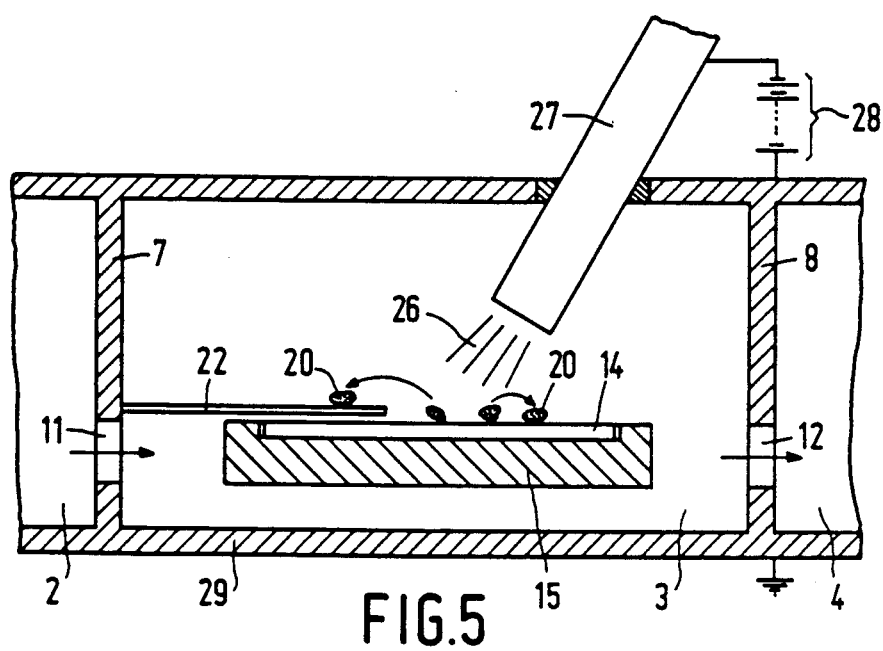

FIG. 5 shows an embodiment which employs a beam of electrically charged particles, for example an electron or ion beam for the displacement of the particles 20. In the present embodiment it is enviszged to use an electron beam which issues from an electron source 27, shown only symbolically. FIG. 5 further shows some steps which may be useful. For example, a direct voltage source 28 is shown by means of which it is achieved that the electron source 27 has a negative electric potential relative to the wall 29 of the particle-displacement station 3. The collector plate 22 is also electrically connected to the wall 29.

Figure 6:
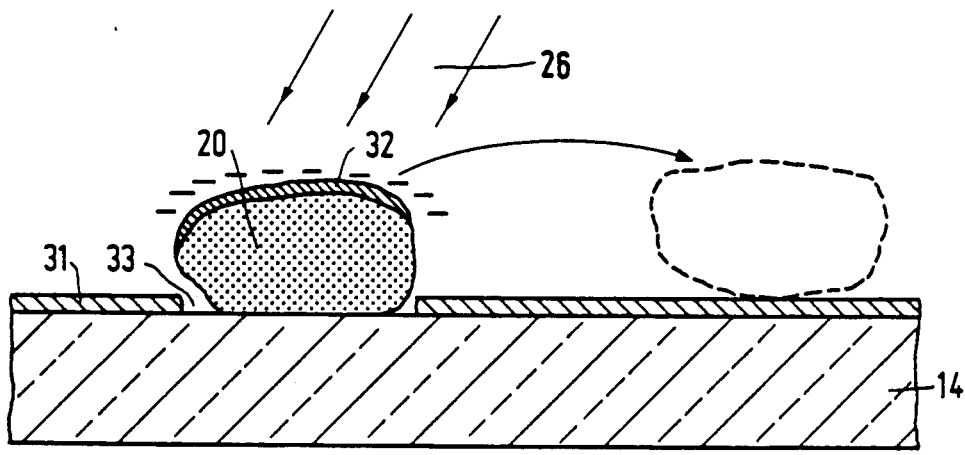
FIG. 6 is a sectional view which is highly enlarged but not to scale, of an undesired particle situated on the surface of a substrate after the first metallizing step.
Figure 7:
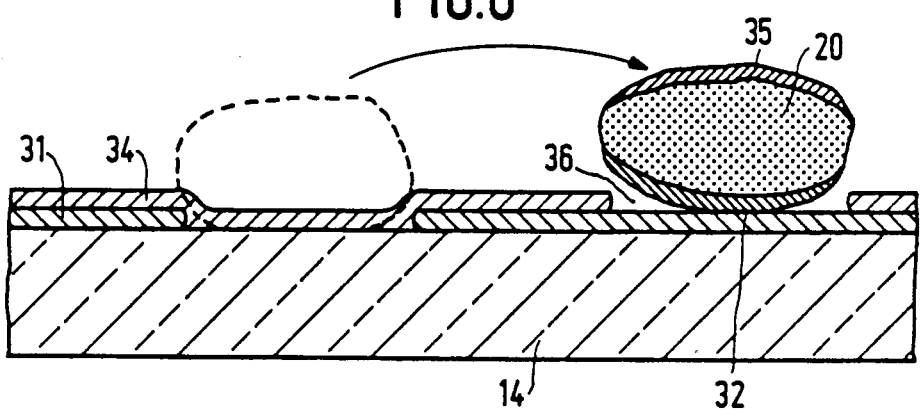
FIG. 7 is a view similar to that in FIG. 6 but showing the surface of the substrate after the second metallization step.

The effect of the use of the electron beam 26 will be explained with reference to FIGS. 6 and 7. FIG. 6 shows a part of the substrate 14 highly enlarged but not to scale, on which substrate a first metal layer 31 has been deposited by a sputtering method. An extraneous particle 20 is situated on the substrate surface and is also provided with a metal coating 32 in the first PVD step. As a result of the shadow effect a pinhole 33 is formed in the metal layer 31 underneath the particle 20. The electron beam 26 causes a negative charge to be built up in the metal layer 32 on the particle 20 because the layer 32 is insulated relative to the layer 31 of the substrate. This results in electrostatic forces being produced between the layer 31 and the layer 32, which cause the particle 20 to be moved from its original position shown in FIG. 6 to a new position shown in FIG. 7 at a certain distance from the pinhole 33. In the second PVD step a second metal layer 34 is formed on the substrate 14. As a result of this, the particle 20, which has not been removed but merely displaced, is provided with a second metal layer 35, while a hole 36 is formed in said second metal layer underneath the particle. However, the pinhole 33 in FIG. 6 is now covered by the second metal layer 34, while the new hole 36 does not have any harmful effect.

In addition to the embodiments described with reference to the drawing, many other embodiments, not shown, are possible within the scope of the invention as defined in the appended patent claims. For the effect of the invention it is irrelevant whether the extraneous particles are completely removed from the substrate surface or are displaced over a small distance. In order to remove and/or displace the particles all the prior-art methods may be used, for example those known from the references cited, either separately or in combination. In addition, entirely different methods of removing the particles may be used, for example the use of fluids and/or the use of means which mechanically contact the substrate surface, such as brushes or cloth like materials. Moreover, the method can also be used advantageously for products other than substrates for optical discs, such as architectural glass or plastic foils, etc.

I claim:

1. A method for the vacuum-coating of a substrate bearing adhering particles, said particles being of a size sufficient to cause holes, visible in transmission, to occur upon PVD coating of the particle-bearing substrate and displacement of said particles, said method comprising;
   (a) introducing said particle-bearing substrate into a vacuum coating arrangement and providing, by a first PVD process in a vacuum a coating on said substrate and said adhering particles,
   (b) displacing resultant coated particles form their initial positions while said substrate is in said vacuum coating arrangement and
   (c) providing an additional coating, on said substrate, of a thickness sufficient to cover any hole caused by particle displacement, by a second PVD process while said substrate is in said vacuum-coating arrangement.

2. A method as claimed in claim 1, characterized in that inside the vacuum-coating arrangement the substrate is transferred from a first PVD station to a particle-displacement station and subsequently from the particle dislocating station to a second PVD station.

3. A method as claimed in claim 2, characterized in that the substrate is passed through a first gas barrier, such as for example a lock or a gate-type lock between the first PVD station and the particle-displacement station, and that in the substrate passes a second gas barrier on its way to the second PVD station.

4. A method as claimed in claim 1, characterized in that a gas jet is employed for the displacement of the particles.

5. A method as claimed in claim 4, characterized in that the gas jet is pulsating.

6. A method as claimed in claim 5, characterized in that the jet width, the pulse duration and the pulse frequency as well as the speed of transport of the substrate are adapted to one another in such a way that substantially the entire coated substrate surface is covered during passage underneath the jet.

7. A method as claimed in claim 6, characterized in that the coated substrate surface as it passes underneath the beam of electrically charged particles is exposed substantially without interruption.

8. A method as claimed in claim 4, characterized in that the gas jet is formed by a supersonic molecular beam.

9. A method as claimed in claim 4, characterized in that the gas required for particle displacement is identical to the gas used as process gas in the two coating steps.

10. A method as claimed in claim 4, characterized in that the gas jet sweeps the substrate across its entire width.

11. A method as claimed in claim 1, characterized in that the intensity and the energy of the beam is adequate to displace the particles under the influence of the electrostatic forces between the substrate and said particles.

12. A method as claimed in claim 1, characterized in that a beam of electrically charged particles, for example an electron or ion beam, is employed for particle displacement.

* * * * *